United States Patent
Salcedo et al.

(10) Patent No.: US 7,202,114 B2
(45) Date of Patent: Apr. 10, 2007

(54) ON-CHIP STRUCTURE FOR ELECTROSTATIC DISCHARGE (ESD) PROTECTION

(75) Inventors: Javier A. Salcedo, Orlando, FL (US); Juin J. Liou, Oviedo, FL (US); Joseph C. Bernier, Palm Bay, FL (US); Donald K. Whitney, Jr., W. Melbourne, FL (US)

(73) Assignees: Intersil Americas Inc., Milpitas, CA (US); The University of central Florida, Orlando, FL (US)

( * ) Notice: Subject to any disclaimer, the term of this patent is extended or adjusted under 35 U.S.C. 154(b) by 30 days.

(21) Appl. No.: 11/032,154

(22) Filed: Jan. 11, 2005

(65) Prior Publication Data
US 2005/0151160 A1 Jul. 14, 2005

Related U.S. Application Data

(60) Provisional application No. 60/535,816, filed on Jan. 13, 2004.

(51) Int. Cl.
H01L 29/72 (2006.01)
H01L 29/74 (2006.01)
H01L 31/111 (2006.01)

(52) U.S. Cl. .............. 438/133; 257/173; 257/174; 257/362; 257/E29.181; 438/140

(58) Field of Classification Search .......... None
See application file for complete search history.

(56) References Cited

U.S. PATENT DOCUMENTS

| | | | | |
|---|---|---|---|---|
| 5,719,733 A | * | 2/1998 | Wei et al. | 361/56 |
| 5,903,420 A | * | 5/1999 | Ham | 361/56 |
| 6,281,527 B1 | * | 8/2001 | Chen | 257/168 |
| 6,498,357 B2 | * | 12/2002 | Ker et al. | 257/173 |
| 6,770,918 B2 | * | 8/2004 | Russ et al. | 257/173 |

* cited by examiner

*Primary Examiner*—Evan Pert
*Assistant Examiner*—Benjamin P. Sandvik
(74) *Attorney, Agent, or Firm*—MH2 Technology Law Group

(57) ABSTRACT

A complementary SCR-based structure enables a tunable holding voltage for robust and versatile ESD protection. The structure are n-channel high-holding-voltage low-voltage-trigger silicon controller rectifier (N-HHLVTSCR) device and p-channel high-holding-voltage low-voltage-trigger silicon controller rectifier (P-HHLVTSCR) device. The regions of the N-HHLVTSCR and P-HHLVTSCR devices are formed during normal processing steps in a CMOS or BICMOS process. The spacing and dimensions of the doped regions of N-HHLVTSCR and P-HHLVTSCR devices are used to produce the desired characteristics. The tunable HHLVTSCRs makes possible the use of this protection circuit in a broad range of ESD applications including protecting integrated circuits where the I/O signal swing can be either within the range of the bias of the internal circuit or below/above the range of the bias of the internal circuit.

10 Claims, 10 Drawing Sheets

ON-CHIP STRUCTURE FOR ELECTROSTATIC DISCHARGE (ESD) PROTECTION

CROSS REFERENCE

This application claims the benefit of and incorporates herein by reference provisional application Ser. No. 60/535,816, filed Jan. 13, 2004.

FIELD OF THE INVENTION

The present disclosure relates in general to electrostatic discharge protection in electronic circuits, and in particular to tunable high holding voltage silicon controlled rectifiers for latch-up free on-chip electrostatic discharge protection and the method of designing these devices.

BACKGROUND OF THE INVENTION

Microchips' size reduction has been traditionally the most important challenge in the semiconductor industry; however, reliability issues and robustness of the circuits present a bottleneck in the integrated circuit (IC) miniaturization tendency. The IC's vulnerability to electrostatic discharge (ESD) is one of the most critical reliability problems. ESD is an event that transfers a finite amount of charge from one object (i.e., human body, transmission lines, or metallic pieces) to the other (i.e., microchip). The process results in a huge current, and when a microchip is subjected to ESD, the microchip is likely to be damaged. Several ESD standards have been defined in the semiconductor industry to model this random phenomenon; they include the human body model (HBM, charge transfers from human body to ground via microchip), machine model (MM, charge transfers from an equipment or metallic tool to ground via microchip), charged device model (CDM, charge is built up on microchip and transfers to ground), and international electrochemical commission (IEC, charge transfers from a charged capacitor through an air discharge to ground via microchip).

Large-scale integration of CMOS devices and the increasing number of external pins have resulted in integrated circuits (ICs) which are very sensitive to ESD events. At times, numerous ICs have been migrated to state-of-the-art CMOS technologies, but direct scaling can reduce the level of ESD protection accordingly. As a result, IC's production tape outs are being considerably delayed mainly because products do not meet the ESD protection requirements.

An IC's ESD protection typically includes supply clamps and Input/Outputs (I/O) pad protection. These ESD protection components should have low leakage current at normal operating voltages and provide very high conductance paths during an ESD event. This guarantees the integrity of the core circuit functionality during handling, assembling, and circuit operation. For sub-micron fully silicided CMOS ICs, ESD protection is even more critical. In these ICs, fabrication process improvements required for device scaling have in turn increased the ESD sensitivity, and reduced the level of stress that typical ESD protection devices can safely support. See, for example:

1. S. Voldman, "A Review of Electrostatic Discharge (ESD) in Advanced Semiconductor Technology," *Microelectronics Reliability*, vol. 44, pp. 33–46, 2004;
2. S. Voldman, W. Anderson, R. Ashton, M. Chaine, C. Duvvury, T. Maloney, E. Worley, "A Strategy for Characterization and Evaluation of ESD Robustness of CMOS Semiconductor Technologies," *EOS/ESD Symposium*, pp. 212–224, 1999; and
3. K. Bock, B. Keppens, V. De Heyn, G. Groeseneken, L. Y. Ching, A. Naem, "Influence of Gate Length on ESD-Performance for Deep Sub-Micron CMOS Technology," *EOS/ESD Symposium*, pp. 95–104, 1999.

Due to the ESD sensitivity of ICs in sub-micron CMOS technologies, devices for on-chip ESD protection occupy a considerable area of the IC. Furthermore, even increasing the size of the traditional protection structures to levels comparable with the core circuit dimensions does not guarantee that the ESD requirements are met. This condition creates a bottleneck for the IC's development and diminishes the potential advantages of the CMOS scaling.

Limitations of typical ESD protection structures can be overcome by designing devices in which the I–V characteristics show voltage snapback. See, for example:

4. V. Vashchenko, A. Concannon, M. Ter Beek and P. Hopper, "LVTSCR structure for latch-up free ESD protection of BiCMOS RF circuits," *Microelectronics Reliability*, vol. 43, pp. 61–69, 2003; and
5. M. -D. Ker and H. -H. Chang, "Cascode LVTSCR with tunable holding voltage for ESD protection in bulk CMOS technology without latchup danger," *Solid-State Electronics*, vol. 44, pp. 425–445, 2000.

These devices present a way to build smaller area I/O protection and supply clamps.

Several on-chip structures have been used to protect integrated circuits from random and fast-transient high voltages caused by ESD, but few are capable of protecting integrated circuits effectively and efficiently against the most demanding ESD models without latch-up. Existing low-voltage trigger thyristor- or Silicon Controlled Rectifier (SCR) devices typically have a very low holding voltage, which would allow latch-up conditions during an ESD event while power was applied. Alternative solutions previously suggested to overcome this drawback include the use of additional components and empirical modification of the lateral structure of the SCR. The former approach adds complexity and consumes additional area on the die and may cause increases in leakage current and parasitic capacitance, and the latter approach is very time-consuming and only possible for some limited cases.

The thyristor- or SCR-type structures snap back to a low holding voltage and high conductance conditions during the on-state. For these devices, once the trigger voltage is reached, high injection of carriers takes place at the anode and cathode regions at low electric field. The low electric field condition held by the device during the on-state allows higher peak current conduction at lower power regimes. Furthermore, the current density in these devices is more uniformly distributed across the cross-sectional area, which permits better dispersion of the heat dissipation, and to some extent avoids hot-spot generation during ESD events.

The Low-Voltage-Trigger-Silicon-Controlled-Rectifier (LVTSCR) uses the advantages of the SCR-type devices but also reduces the trigger voltage to levels acceptable for use in CMOS IC protection. See, for example:

6. A. Chatterjee and T. Polgreen, "A Low-Voltage Triggering SCR for On-Chip ESD Protection at Output and Input Pads," *IEEE Electron Device Letters*, vol. 12, pp. 21–22 Jan. 1991.

This device provides one of the best alternatives for the design of I/O protection and supply clamps. The LVTSCR I–V characteristics show a low holding voltage and a low holding current (Ref 4–6). These characteristics are convenient for some submicron CMOS technologies, but for circuits with operating voltages above about 1.5V, ESD protection implemented with this device has the risk of latch-up problems.

SUMMARY OF THE INVENTION

The presently disclosed SCR-based structure has been designed, fabricated, and measured with consistent design criteria to enable a tunable holding voltage for robust and versatile ESD protection. The structure has been designed, fabricated and measured in two complementary versions, n-type and p-type, each of them with slightly different characteristics. The SCR-based structure will be referred to hereafter as n-channel high-holding-voltage low-voltage -trigger silicon controller rectifier (N-HHLVTSCR) device and p-channel high-holding-voltage low-voltage -trigger silicon controller rectifier (P-HHLVTSCR) device. A disclosed ESD protection circuit provides a versatile, efficient and reliable ESD protection solution based on both the N-HHLVTSCR and P-HHLVTSCR devices.

The regions of the N-HHLVTSCR and P-HHLVTSCR devices are formed during normal processing steps in a CMOS or BICMOS process. The spacing and dimensions of the doped regions of N-HHLVTSCR and P-HHLVTSCR devices are used to produce the desired characteristics. Among other advantages, the holding voltage of the present HHLVTSCRs is tunable and can be accurately controlled. This flexibility makes possible the use of this protection circuit in a broad range of ESD applications including protecting integrated circuits where the I/O signal swing can be either within the range of the bias of the internal circuit, which is the case of a typical signal-processing microchip, or below/above the range of the bias of the internal circuit, which is the case of many communication transceivers.

The present high holding, low voltage trigger silicon controlled rectifier device includes an N-type layer on a P-type substrate and an N-type tub region having a first portion extending from a top surface of the N-type layer to the P-type substrate and a second portion extending into the P-type substrate. Adjacent P-type and N-type well regions are in the top surface of the N-type layer between walls of the first portion and over the second portion the N-type tub region. Spaced source and drain regions of a first conductivity type are in one of the wells of a conductivity type opposite the first conductivity type. The drain region extends into the other of the wells of the same conductivity type. An insulated gate is over the space between the source and drain regions. A region of the opposite conductivity type is in the other well. A contact region of the first conductivity type is in the other well and a contact region of the other conductivity type is in the one well. A first contact connects the gate and the source region and forms a first terminal of the device, and a second contact is connected to the region of the opposite conductivity type and forms the second terminal.

The present disclosure devices are part of an input protection circuit connected to the input of an integrated circuit having an operating range of input signals to be received on an input terminal and a biasing window between first and second biasing terminals. The protection circuit includes a first low voltage trigger SCR having an anode, anode gate, cathode gate, cathode and an insulated gate. Referring to FIG. 5A, the anode is the P+ contact 32 in the n-well 16, the anode gate is the N+ contact 34 in the n-well 16, the cathode is the N+ contact 26 in the p-well 18, the cathode gate is the P+ contact 28 in the p-well 18 and the insulated gate is the MOS gate 20. The anode and the anode gate are connected to the input terminal, the cathode and the cathode gate are connected to the second biasing terminal, and the insulated gate is connected to one of the input terminal and the second biasing terminal for integrated circuits where the operating range of input signals is within the biasing window. The anode is connected to the input terminal, the cathode and the cathode gate are connected to the second biasing terminal, the insulated gate being connected to one of the input terminal and the second biasing terminal, and the anode gate is open for integrated circuits where the operating range of input signals extends beyond the biasing window.

The present disclosure is also directed to a method of making the input protection devices.

Other objects, advantages and novel features of the present invention will become apparent from the following detailed description of the invention when considered in conjunction with the accompanying drawings.

DETAILED DESCRIPTION OF THE PREFERRED EMBODIMENT

Figure 1:
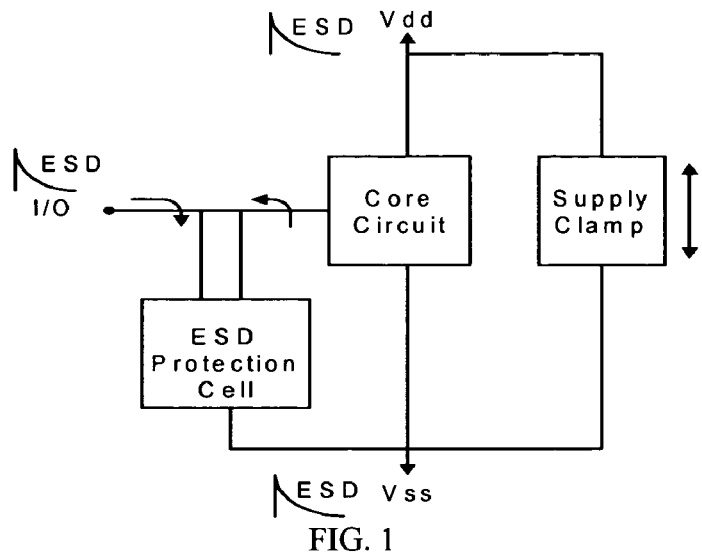
FIG. 1 is a schematic for complete ESD protection of the present disclosure.

This disclosure presents an ESD protection solution by using the schematic presented in FIG. 1, and highly efficient silicon controlled rectifier (SCR) design, called the high holding voltage/low voltage trigger SCR (HHLVTSCR), for the supply clamp and I/O ESD protection cell shown in FIG. 1. The N-HHLVTSCR and P-HHLVTSCR possess a very low leakage current and a tunable holding voltage from less than 2 V to over 11 V.

The schematic in FIG. 1 is slightly different from the schemes traditionally used for ESD protection. In our design, the complete ESD protection is accomplished with a bidirectional ESD protection, with only a ground reference at the I/O pads, and a bidirectional supply clamp. Based on this approach, either identical or different structures can be designed for the supply clamp and I/O protection cell, depending on the bias conditions during normal operation of the internal circuit. For instance, the signal swing at the I/O pad can be either within the range of the bias of the internal circuit, which is the case of a typical signal-processing microchip, or below/above the range of the bias of the internal circuit, which is the case of a communication transceiver. The first scenario can make use of the standard diode protection to the power supply rails.

The protection scheme in FIG. 1 is an immediate solution for the second scenario described above, but it also provides other advantages such as:

(1) Reduction of the number of devices for the complete ESD protection and therefore less parasitic effects; (2) Less perturbations/noise in the power rail due to ESD events at the I/O pads; and (3) A reduction in the chip area used by the ESD protection structure and $V_{DD}$ power rail. Thus, this ESD protection scheme is very robust and efficient.

Figure 2A:
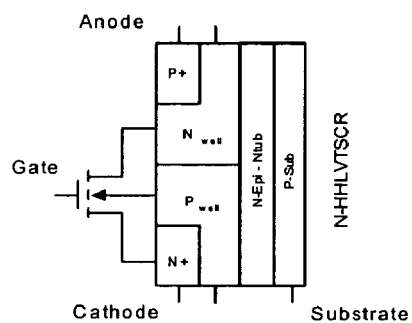
FIGS. 2A, and 2B are a graphical representation of the N-HHLVTSCR and its simplified symbol of the present disclosure.
Figure 2B:
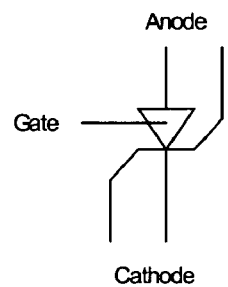
Figure 2C:
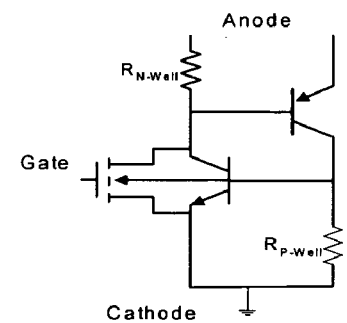
FIGS. 2C and 3C are the equivalent circuits for the N-HHLVTSCR and the P-HHLVTSCR of FIGS. 2A and 3A, respectively.
Figure 3A:
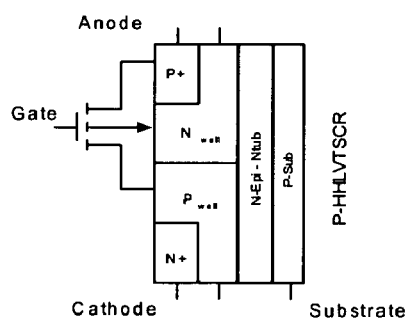
FIGS. 3A, and 3B are a graphical representation of the P-HHLVTSCR and its simplified symbol of the present disclosure.
Figure 3B:
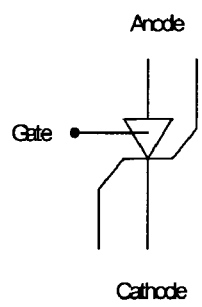
Figure 3C:
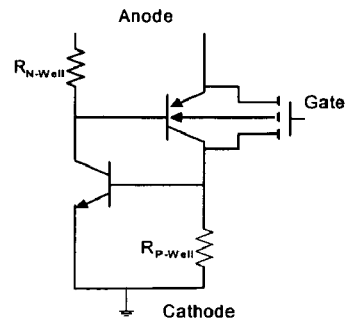
Figure 4A:
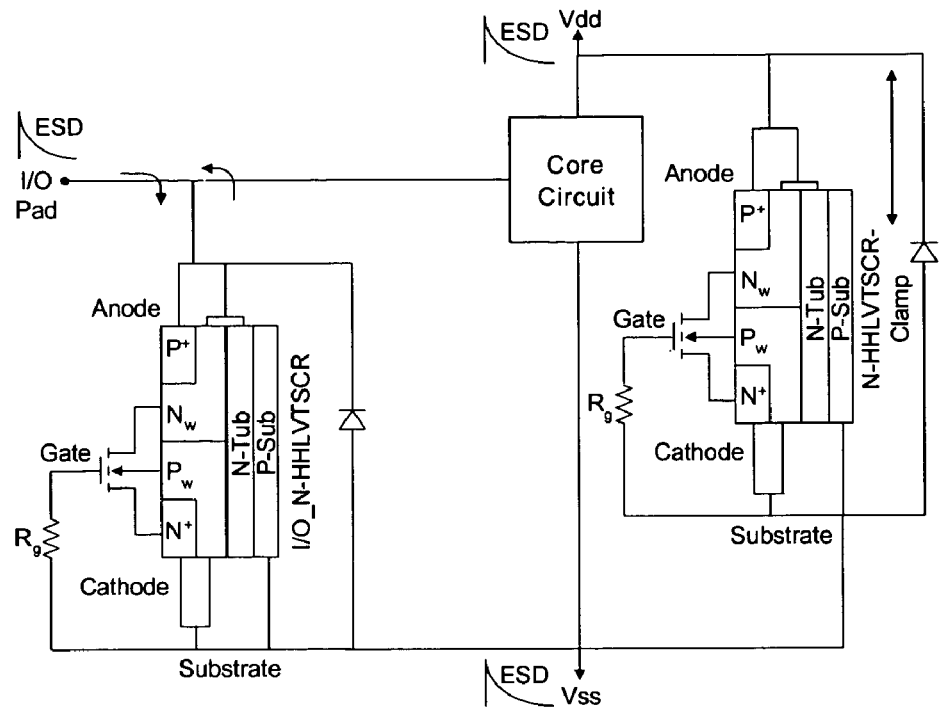
FIGS. 4A, 4B and 4C are detailed schematic diagrams of three different ESD protection schemes (for different normal bias conditions at the I/O pad) based on the N-HHLVTSCR and P-HHLVTSCR of FIGS. 2A and 3A.
Figure 4B:
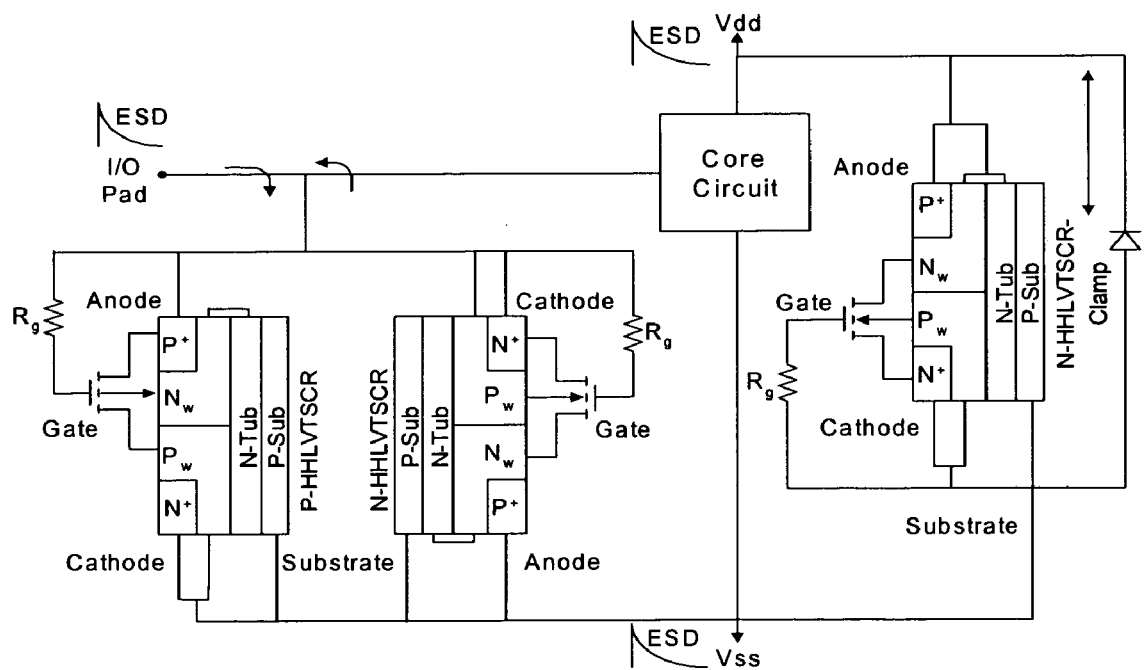
Figure 4C:
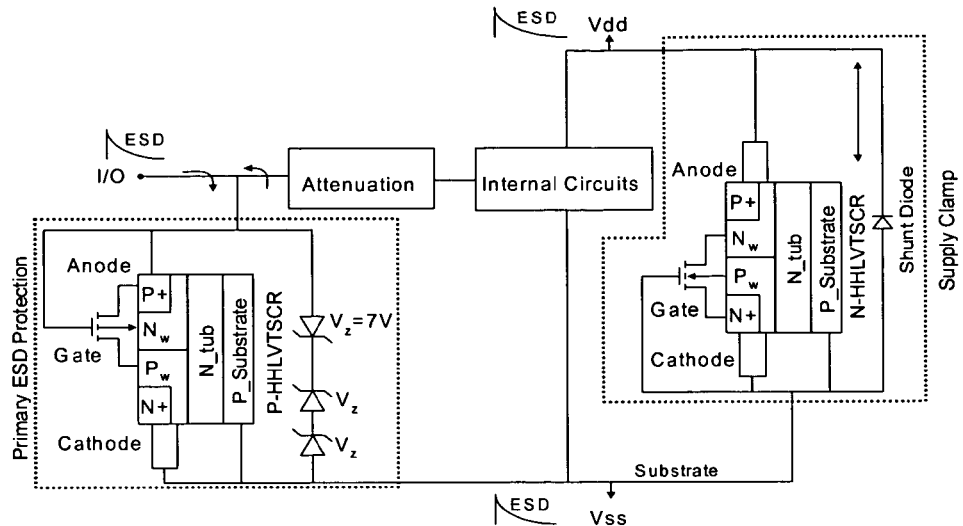

The N-HHLVTSCR and P-HHLVTSCR of the present disclosure are used for the construction of the ESD protection scheme given in FIG. 1, and their graphical representations and symbols are given in FIGS. 2A, 2B and FIGS. 3A, 3B, respectively. The equivalent circuits of the N-HHLVTSCR and P-HHLVTSCR are illustrated in FIGS. 2C and 3C, respectively. FIG. 4A shows the detailed diagram of an ESD protection scheme using an N-HHLVTSCR for the supply clamp and an N-HHLVTSCR for the I/O ESD protection cell. This particular scheme is applicable for the scenario where the normal voltage swing at the I/O pad does not go below Vss. A different protection scheme, but also using the HHLVTSCRs, is required if the normal I/O voltage swing is outside the range of both of the power supplies (Vcc and Vss). Such a scheme, as illustrated in FIG. 4B, includes N-HHLVTSCR for the supply clamp and an N-HHLVTSCR and a P-HHLVTSCR in parallel for the I/O ESD protection cell. FIG. 4C illustrates a variation of FIG. 4B wherein the parallel N-HHLVTSCR is replaced by a diode stack. This scheme alternatively supports applications that require bipolar and asymmetric operating voltage, e.g. I/O voltages ranging from −7 V to 12 V. In this example, the diode stack provides protection against ESD below −7 V and the HHLVTSCR protects against ESD above 12 V.

Figure 5A:
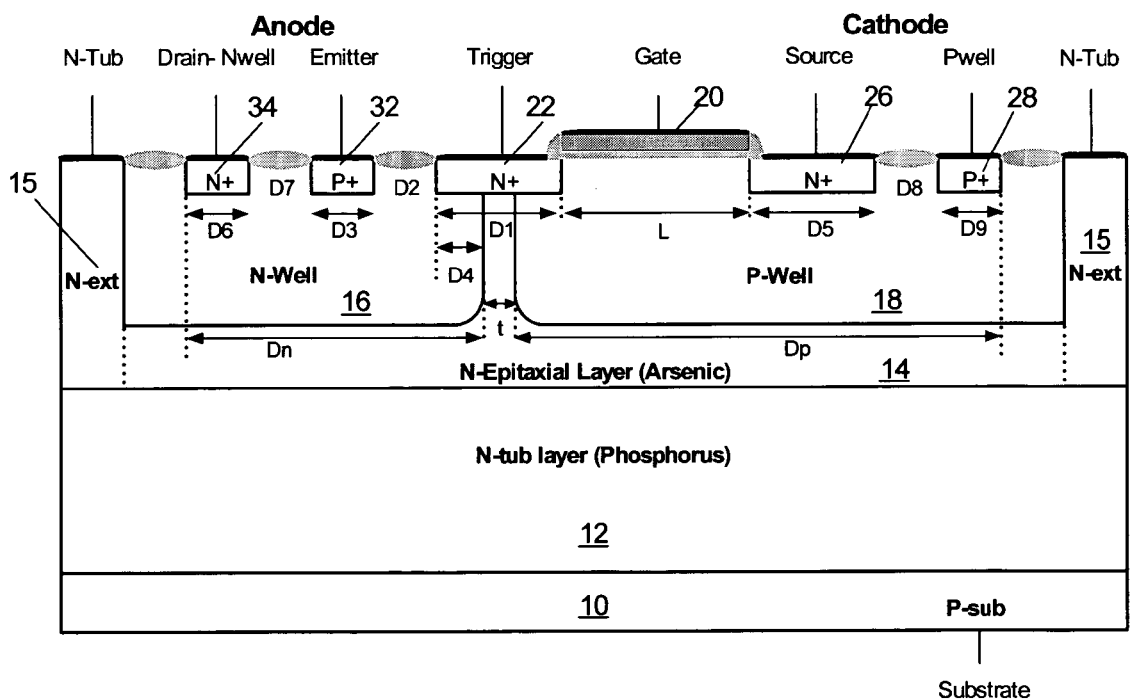
FIGS. 5A and 5B are cross-sectional views of the N-HHLVTSCR and P-HHLVTSCR of FIGS. 2A and 3A, respectively.
Figure 5B:
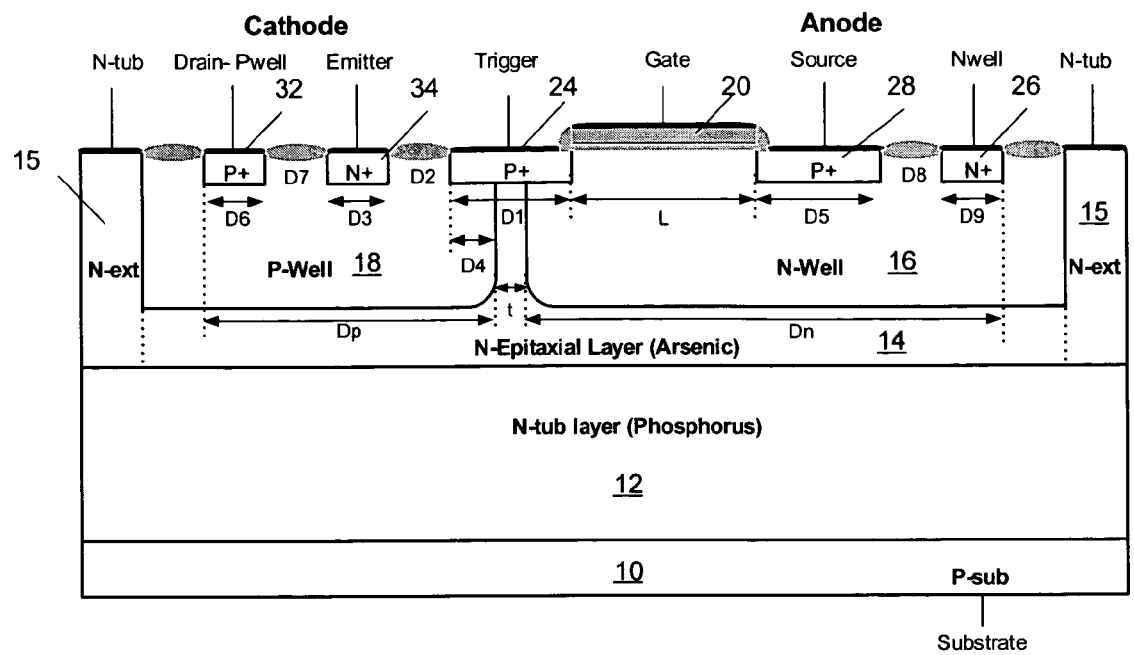

The cross-sectional views of the N-HHLVTSCR and P-HHLVTSCR are illustrated in FIGS. 5A and 5B, respectively. These devices can be fabricated using a standard CMOS process without any additional steps, and the device make-up can be modified to meet the ESD requirements for different applications and voltage ranges.

In a preferred embodiment, a phosphorus n-tub layer 12 is formed over a p-doped silicon wafer 10. An arsenic n-epitaxial layer 14 is grown subsequently. N-extensions 15 are formed around the effective area of the device.

An N-well 16 is implanted to be used as the drain in the N-HHLVTSCR or the P-MOS body in the P-HHLVTSCR. A P-well 18 is implanted into the epi-layer parallel to the previous N-well to be used as the N-MOS body in the N-HHLVTSCR or the drain in the P-HHLVTSCR. These layers extend laterally during the annealing process and create p-n junctions, and a small gap "t" between the p-n junctions can be designed to increase the magnitude of the trigger and holding current. A thin and lightly doped P-layer may be implanted in the N-well to control the threshold voltage of the P-MOS devices.

A P+ polysilicon layer 20 is deposited inside the P-well and N-well for the subsequent formation of an embedded field effect transistor in the N-HHLVTSCR and P-HHLVTSCR, respectively. This poly-gate is normally used as a trigger point in the base of the lateral BJT shown in FIGS. 2C and 3C to produce a low trigger voltage. However, in modern technologies where very thin oxides could be damaged during the ESD event, an alternative substrate trigger can be used instead, and the polysilicon is used just as a dummy gate that provides a better control for the N+ or P+ implantation and avoids the formation of a deep LOCOS isolation which can degrade the current conduction of the ESD protection cell.

LDD N+ and P+ regions 22, 24 are implanted over the junction or gap between the N-well 16 and P-well 18 for the N-HHLVTSCR and P-HHLVTSCR, respectively. N+ and P+ regions 26, 28 are implanted in the P-well 18 and N-well 16 for the N-HHLVTSCR and P-HHLVTSCR, respectively. Regions 26 and 28 are the cathode of the N-HHLVTSCR and the anode of the P-HHLVTSCR respectively. As shown in FIGS. 4A, 4B and 7-9, regions 26 and 28 are tied together in some configurations.

LDD P+ and N+ regions 32, 34 are implanted in the N-well 16 and P-well 18 for the N-HHLVTSCR and P-HHLVTSCR, respectively. Regions 32 and 34 are the anode of the N-HHLVTSCR and the cathode of the P-HHLVTSCR, respectively. As shown in FIGS. 4A and 4B, regions 32 and 34 are tied together in some configurations.

Note that N+ regions 22, 26 and 34 may all be implanted in one process step, or may be separate implantations. Likewise, P+ regions 24, 28 and 32 may all be implanted in one process step, or may be separate implantations.

The method of forming a tuned high holding low voltage trigger silicon controlled rectifier (HHLVTSCR) may be summarized as including the following steps:

providing a crystalline silicon substrate with p-type doping concentration in the range of $5 \times 10^{15}$ cm$^{-3}$ and an epitaxially-grown n-type layer;

depositing a deep N-tub layer in an effective area of the HHLVTSCR;

ion implanting N and P type impurities forming an N-well with average doping concentration of $8 \times 10^{17}$ cm$^{-3}$ and a P-well with average doping of $2.6 \times 10^{18}$ cm$^{-3}$ spaced at an optimized distance over the N-tub layer;

forming N- and P-type high-doping concentration regions laterally spaced from each other at optimized distances in each of the N-well and P-well;

forming an N type high-doping concentration bridge region over the N-well to P-well junction for an N-HHLVTSCR and a P type high-doping concentration bridge region over the N-well to P-well junction for a P-HHLVTSCR of an optimized dimension and distance from the other regions;

forming an insulated gate over the N-well for the P-HHLVTSCR and an insulated gate over the P-well for the N- HHLVTSCR;

forming a common contact for the high-doping n- and p-type regions in the P-well and the gate for the N-HHLVTSCR and a common contact for the high-doping n- and p-type regions in the P-well for the P-HHLVTSCR;

selectively forming either a common contact for the high-doping n- and p-type regions in the N-well and the gate or a common contact for the high-doping p-type region in the N-well and the gate and a separate contact for the high-doping p-type region in the N-well for the P-HHLVTSCR; and selectively forming either a common contact or separate contacts for the high-doping n- and p-type regions in the N-well for the N-HHLVTSCR.

Figure 6A:
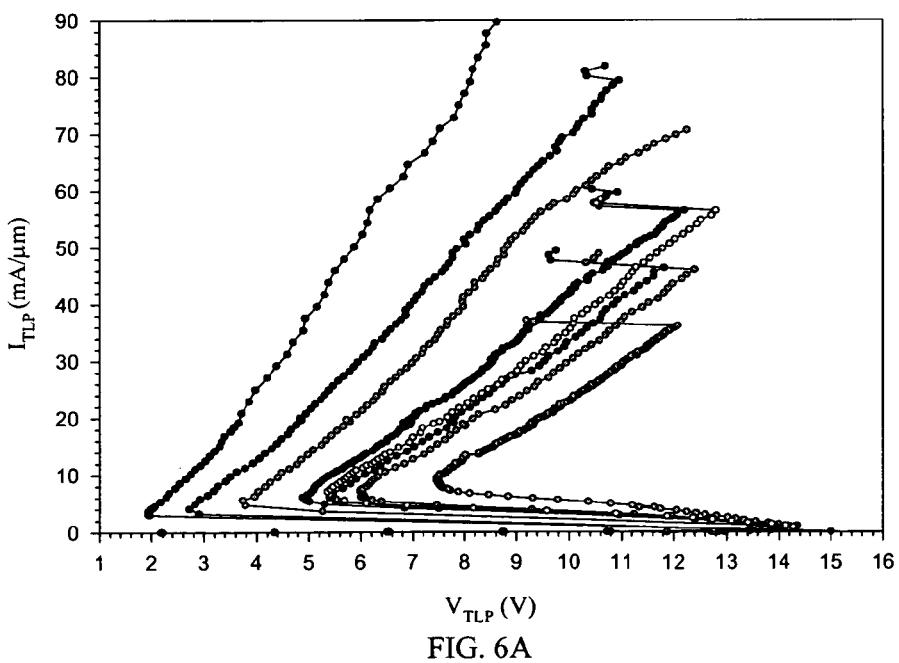
FIGS. 6A and 6B are graphs showing a set of measured transmission line pulse (TLP) I–V characteristics with tunable holding voltages for the N-HHLVTSCR and P-HHLVTSCR, respectively.
Figure 6B:
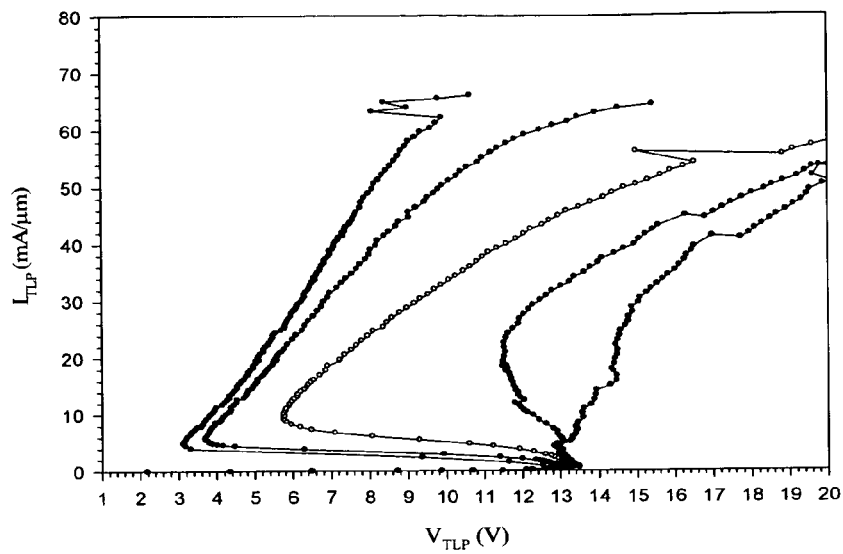

HHLVTSCRs with various dimensions were designed and fabricated in a silicide triple-well Bi-CMOS process. The current-voltage characteristics of these devices were measured on-wafer using a Barth 4002 transmission line pulse (TLP) tester with a square pulse duration of 100 ns and rise time of 10 ns. Different spacings of the regions between the anode and cathode in the N-HHLVTSCR and P-HHLVTSCR shown in FIGS. 5A and 5B were considered, and their corresponding holding ($V_H$) and trigger ($V_T$) voltages are illustrated in TABLES 1 and 2, respectively. The measured current-voltage characteristics of some of these devices are also given in FIGS. 6A and 6B for the N-HHLVTSCR and P-HHLVTSCR, respectively. These devices exhibit a very low leakage current in the off state, very high conducting current in the on state, and wide-range, tunable holding voltage, all of which are of paramount importance to the design and development of robust, versatile, and efficient on-chip ESD protection structures.

TABLE 1

| Name | L | D1 | D2 | D3 | D4 | D5 | D6 | D7 | D8 | D9 | $V_H(V)$ | $V_T(V)$ |
|---|---|---|---|---|---|---|---|---|---|---|---|---|
| N-Cell 1 | 7 | 1.6 | 0.6 | 3.2 | 1.6 | 3.2 | 1.6 | 0.6 | 0.6 | 1.6 | 1.9 | 14.5 |
| N-Cell 2 | 7 | 3.2 | 0.6 | 3.2 | 1.6 | 3.2 | 1.6 | 0.6 | 0.6 | 1.6 | 2.7 | 13.6 |
| N-Cell 3 | 7 | 3.2 | 0.6 | 1.6 | 1.6 | 1.6 | 1.6 | 0.6 | 0.6 | 1.6 | 3.7 | 13.8 |
| N-Cell 4 | 7 | 4.8 | 0.6 | 1.6 | 3.2 | 1.6 | 1.6 | 0.6 | 0.6 | 1.6 | 4.9 | 14.3 |
| N-Cell 5 | 7 | 5.1 | 0.6 | 1.6 | 3.2 | 1.6 | 1.6 | 0.6 | 0.6 | 1.6 | 5.1 | 14.3 |
| N-Cell 6 | 7 | 6.4 | 0.6 | 1.6 | 3.2 | 1.6 | 1.6 | 0.6 | 0.6 | 1.6 | 5.5 | 13.8 |
| N-Cell 7 | 7 | 7.3 | 0.6 | 1.6 | 3.2 | 1.6 | 1.6 | 0.6 | 0.6 | 1.6 | 6.0 | 14.2 |
| N-Cell 8 | 7 | 8 | 0.6 | 1.6 | 4.8 | 1.6 | 1.6 | 0.6 | 0.6 | 1.6 | 7.5 | 14.2 |

Dimensions in μm
All cells have a width of 100 μm

TABLE 2

| Name | L | D1 | D2 | D3 | D4 | D5 | D6 | D7 | D8 | D9 | $V_H(V)$ | $V_T(V)$ |
|---|---|---|---|---|---|---|---|---|---|---|---|---|
| P-Cell 1 | 0.7 | 3.2 | 0.6 | 1.6 | 1.6 | 1.6 | 1.6 | 0.6 | 0.6 | 1.6 | 3.2 | 12.7 |
| P-Cell 2 | 3.5 | 3.2 | 0.6 | 1.6 | 1.6 | 1.6 | 1.6 | 0.6 | 0.6 | 1.6 | 3.9 | 13.4 |
| P-Cell 3 | 7 | 3.2 | 0.6 | 1.6 | 1.6 | 1.6 | 1.6 | 0.6 | 0.6 | 1.6 | 5.8 | 13.5 |
| P-Cell 4 | 7 | 4.8 | 0.6 | 1.6 | 3.2 | 1.6 | 1.6 | 0.6 | 0.6 | 1.6 | 11.8 | 13.5 |
| P-Cell 5 | 7 | 8 | 0.6 | 1.6 | 4.8 | 1.6 | 1.6 | 0.6 | 0.6 | 1.6 | 12.9 | 13.4 |

Dimensions in μm
All cells have a width of 100 μm

Figure 7:
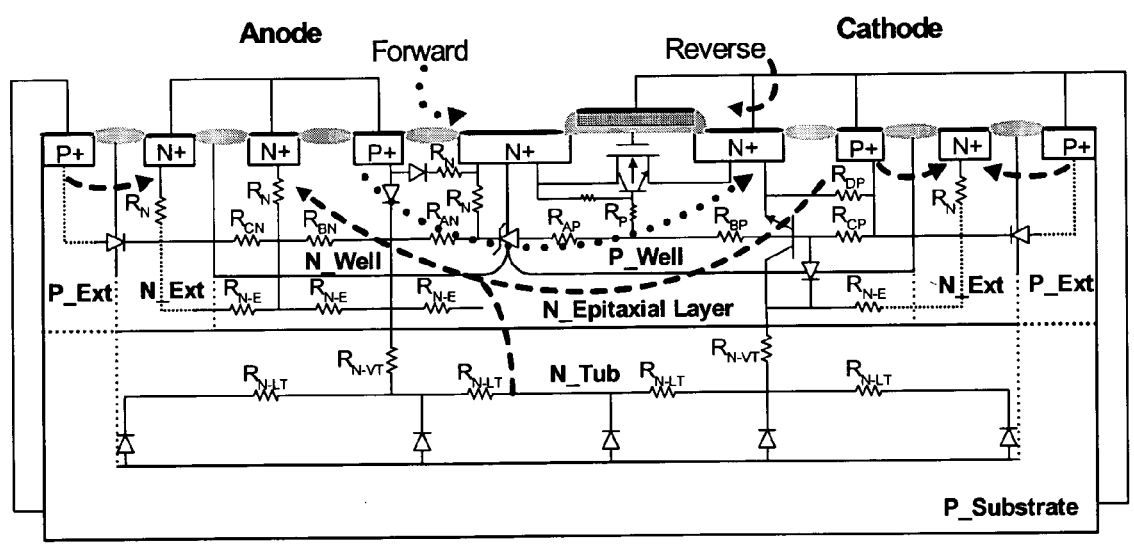
FIG. 7 is a cross-sectional view of the N-HHLVTSCR with the illustration of dominant parasitics for forward and reverse operation conditions for the low reverse voltage design.
Figure 11:
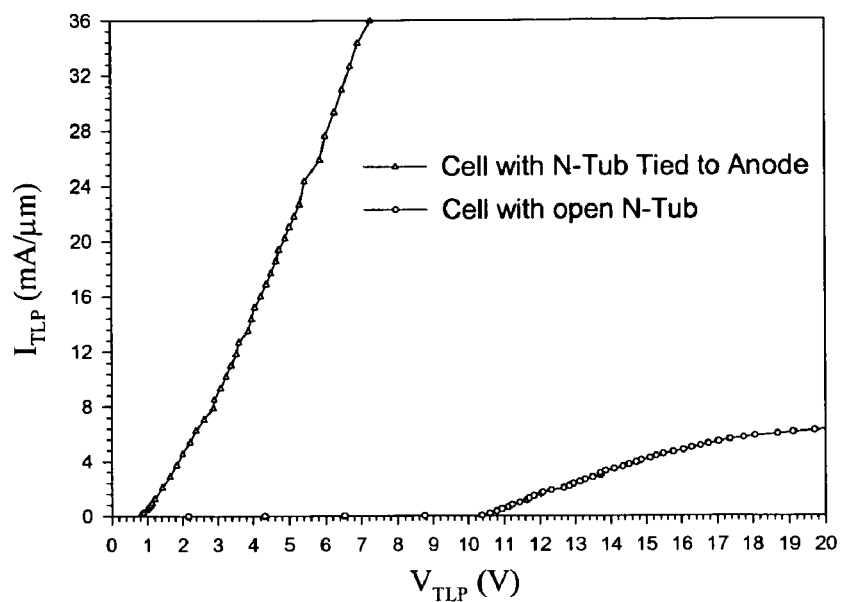
FIG. 11 is a graph of the reverse I–V characteristics of the open-$N_{tub}$ and connected $N_{tub}$ HHLVTSCRs.

Two different HHLVTSCR terminal connections yield different reverse breakdown ($V_r$) voltages. A detailed explanation will focus on the N-HHLVTSCR, since the same concept applies to the P-HHLVTSCR. For the proper operation of N-HHLVTSCRs, the cathode contact always connects the gate, n+ and p+ terminals on the right-hand side of the structure, as shown in FIG. 7. On the other hand, the anode contact can be connected in two different ways. The different connection schemes affect the reverse breakdown voltage and the conducting capability for the negative ESD strike as illustrated in FIG. 11.

The first, called the HHLVTSCR with N-Tub connected, links the anode to the N-Tub by connecting all the N-Tub, n+, and p+ terminals on the left-hand side of the structure as shown in FIG. 7. The cathode is tied to the substrate and is grounded. In the forward operating condition, during an ESD event the anode voltage experiences an abrupt rise and the SCR phenomenon is manifested when the field across the HHLVTSCR forces the breakdown of the embedded MOSFET's shunt NPN bipolar or the reverse breakdown of the laterally distributed blocking NWell-PWell junction. This creates a feedback effect where all the parasitic devices interact simultaneously and exhibit different conduction characteristics with an avalanche multiplication effect. It gives rise to a regenerative condition that: (1) drops the voltage between the terminals of the device (snapback) to a given holding voltage ($V_H$) once the trigger voltage ($V_T$) is reached, and (2) abruptly increases the current passing through the device.

In the cross section presented in FIG. 7, the snapback behavior is attributed to distributed vertical and lateral bipolar effects. The mechanism of operation in the region formed in parallel with the field effect transistor involves avalanche breakdown, high impact ionization and turn on of the lateral NPN. Once the potential barrier in the blocking junction reaches the conduction condition (breakdown), the cell is able to take advantage of multiple high conduction paths for distributed current flux both along the surface and in the bulk and to abruptly drop the voltage level to $V_H$. The holding voltage has been found to be dependent on almost all the lateral dimensions illustrated in FIGS. 5A and 5B, respectively.

In the reverse operation condition, the voltage is determined by the forward biased PN junctions. As a result, the reverse breakdown voltage is about equal to 0.7 V, for example, and the conducting current is relative high. This condition embedded inside the cell is observed in FIG. 7, where the N-Well is tied to the N-extension and both of them are tied to the emitter. Considering that the P-type substrate is commonly grounded, if the value of the anode is forced below ground by a negative ESD event, at the junction $P_{Sub}$–($N_{tub}$–$N_{epi}$–$N_{Well}$), the current increases exponentially and the maximum negative voltage is clamped by a forward biased junction. Therefore, the reverse current is very well distributed along the vertical and lateral directions of the device further improving the amount of reverse current per unit area that the device can support.

Figure 8:
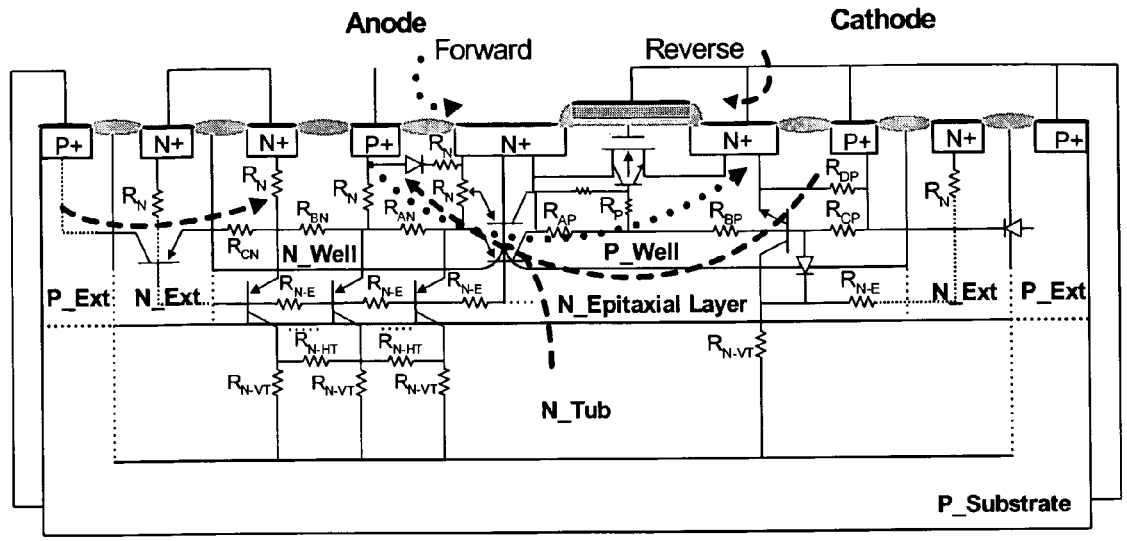
FIG. 8 is a cross-sectional view of the N-HHLVTSCR with the illustration of dominant parasitics for forward and reverse operation conditions for the high reverse voltage design.

The other possible connection, called the HHLVTSCR with N-Tub open, is to separate the anode contact from the N-Tub, as shown in FIG. 8. In this case, the anode contact is connected only to the p+ region, but not to the n+ and N-Tub terminals on the left-hand side of the structure. Note that the connection of the cathode is the same as that for the HHLVTSCR with N-Tub connected. For this connection scheme under reverse bias condition, the N-Tub terminal is floating, and the cathode and anode are connected internally through several shunt open-base parasitic PNP bipolar junction transistors (BJTs) formed by the P+ anode, N-epi, and P+ cathode, as shown in FIG. 8. Consequently, the reverse breakdown voltage of the HHLVTSCR is about equal to the emitter-collector breakdown voltage of the parasitic BJTs and the resulting current passing through these parasitic BJTs is relatively low.

In forward bias, the current follows the path indicated by the bold dashed line in FIG. 8. In this case, the concentration of electrons and holes injected from the N+ to the P+ regions are orders of magnitude larger than the contributions from the lightly doped $N_{well}$ and $P_{well}$ regions, which correspond to the open base of the lateral parasitic PNP and the grounded base of lateral NPN transistors respectively, FIG. 8. Thus the background doping in the base of the transistors becomes insignificant and the internal charge distribution can be understood to a first approximation as similar to the forward operation of the P-I-N diode complemented with the triggering of the embedded field effect transistor, BJT diffusion current and the resistive network presented in FIG. 8.

In reverse bias, the current flux is indicated by the dotted line in FIG. 8. In this operating condition, the voltage on the anode is allowed to be operating below ground without any reverse conduction in the device. In order to evaluate how flexible the design of this cell is within a given technology, two groups of open base shunt bipolar transistors (BJTs) illustrated in FIG. 8 need special attention. A first group of lateral shunt PNPs are formed parallel to the cell's surface by the (P+–$P_{Well}$)–(N+–$N_{well}$)–P+ combination and the second group of shunt PNPs is vertically distributed between the $P_{sub}$–($N_{tub}$–$N_{epi}$–$N_{Well}$)–P+. In this condition the breakdown of the lateral distributed BJTs with open base has been found to be higher than the breakdown of the vertically distributed BJTs with open base. The open base reverse breakdown voltage (OBV) for this combination was found to be about −10.5 Volts. This voltage can be different in other Bi-CMOS technologies and even can be changed in the presented technology by using other combinations of wells, and it can present additional opportunities or constraints on the design. In this cell, the reverse voltage is high enough and provides ESD protection design flexibility for most of the applications that can be developed in similar technologies.

FIG. 8 also shows the current path, which has been indicated across the lateral and vertical shunt BJTs. A small component of the total current is observed in the shunt lateral BJTs formed by the (P+–$P_{Well}$)–(N+–$N_{well}$)–P+, but this current is almost negligible at the level of voltage that the substrate-anode BJT starts conducting. Due to this condition and to the low conductivity of the open base vertical BJTs in reverse bias, the maximum reverse current that the cell can support once OBV is reached is significantly smaller than that obtained in the forward condition and generally not suitable for ESD protection. Thus, either bidirectional shunt HHLVTSCR arrays or HHLVTSCRs with a shunt zener diode tuned at the right reverse condition, present alternative designs to protect against high level of stress in both directions of the current.

Figure 9:
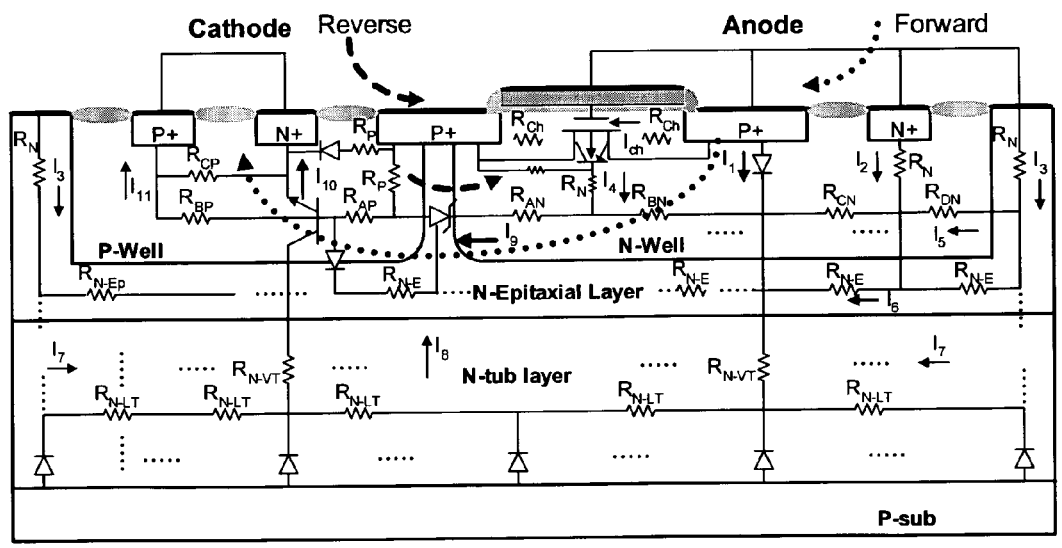
FIG. 9 is a cross-sectional view of the P-HHLVTSCR with the illustration of dominant parasitics for forward operation conditions for the low reverse voltage design.
Figure 10A:
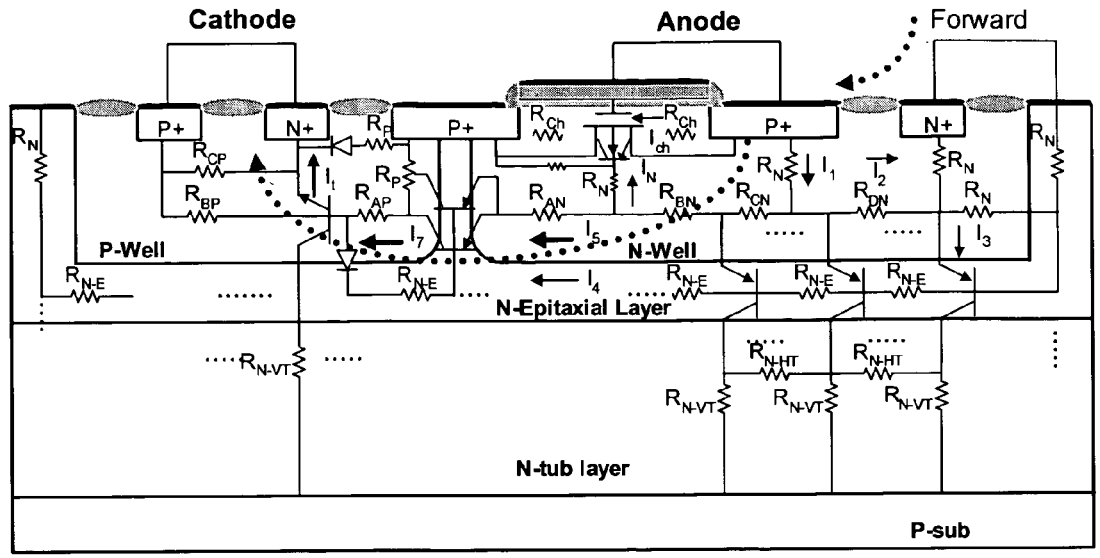
FIGS. 10A and 10B are cross-sectional views of the P-HHLVTSCR with the illustration of dominant parasitic for forward and reverse operation conditions for the high reverse voltage design.
Figure 10B:
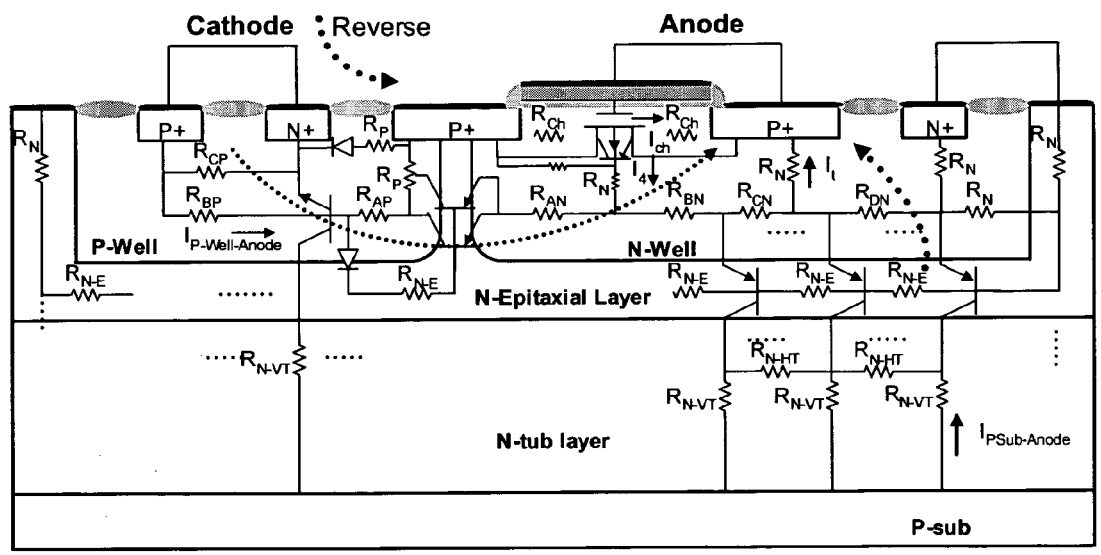

The two possible connections for a P-HHLVTSCR are illustrated in FIGS. 9, 10A and 10B. The P-HHLVTSCR with N-Tub connected, links the anode to the N-Tub by connecting all the N-Tub, n+, and p+ terminals on the right-hand side of structure as shown in FIG. 9. The other possible connection of the P-HHLVTSCR with N-Tub open, is to separate the anode contact from the N-Tub, as shown in FIGS. 10A and 10B. In this case, the anode contact is connected only to the p+ region, but not to the n+ and N-Tub terminals on the right-hand side of the structure. Whereas FIG. 9 shows the forward and reverse current flow, FIG. 10A shows the forward current flow and 10B shows the reverse current flow. This operation is analogous to the N-HHLVTSCR described above.

Figure 12:
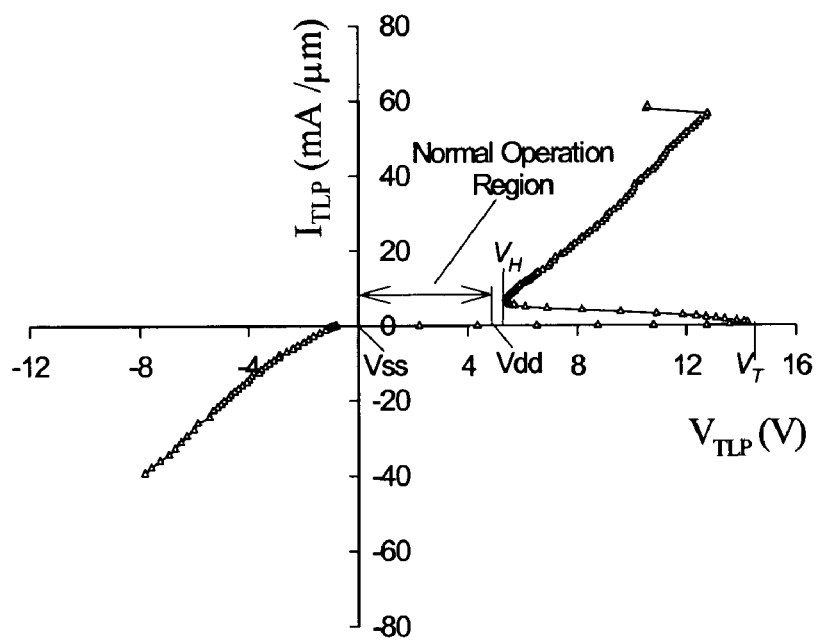
FIG. 12 is a graph of the forward and reverse I–V characteristics of the $N_{tub}$ connected to an anode of an N-HHLVTSCRs of FIGS. 4A and 7.
Figure 13:
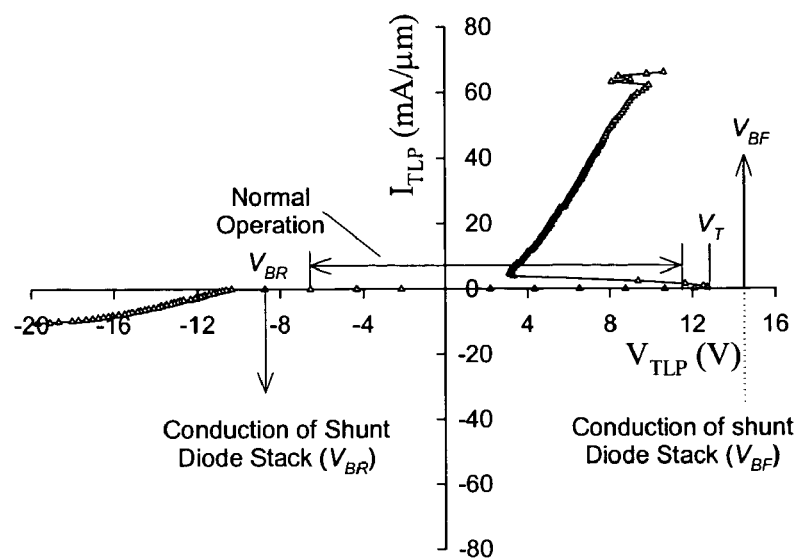
FIG. 13 is a graph of the forward and reverse I–V characteristics of the $N_{tub}$ floating an N-HHLVTSCRs of FIG. 8.

The two different types of anode connections yield considerable difference in the reverse breakdown voltage and conducting current in the negative region of the HHLVTSCR, as evidenced by the data measured from two identical N-HHLVTSCRs but having different connections shown in FIG. 11. Clearly, the reverse breakdown voltage is increased but the conducting capability is decreased (i.e., smaller I–V curve slope) notably when the N-Tub terminal is not connected to the anode. Note that the different terminal connections also alter slightly the characteristics in the positive region as shown in FIGS. 12 and 13, i.e. the devices with N-Tub open depict lower trigger and holding voltages.

In order to illustrate ESD protection designs with HHLVTSCRs, two very common ESD protection conditions are discussed: 1) bidirectional protection at the I/O pad considering normal operation at voltages within the normal supply voltage of the protected circuit, and 2) bidirectional protection at the I/O pad for applications with bipolar input signals outside the circuit power supply range.

A simple example is the ESD protection of a first group of digital IC in which the range of the pad voltage is within the supply voltage of Vss=0 and Vdd=5 V. For this IC, the most common ESD concern is the human body model (HBM). The HHLVTSCR-based ESD protection design for this application is fairly straightforward, as the pad protection cell would not turn on during normal operation, provided the trigger voltage of the cell is slightly larger than Vdd in the positive ESD and slightly smaller than Vss in the negative ESD. For the supply clamp, an additional requirement is that its holding voltage must be equal to or larger than Vdd−Vss=5 V to prevent ESD latchup. Thus, two identical N-HHLVTSCR with N-Tub connected can be used for the pad protection cell and supply clamp, as shown in FIG. 4A. The purpose of the diode connected in parallel with the HHLVTSCR is to increase the current capacity in the Vss-to-Vdd conducting path. FIG. 12 shows the TLP characteristics of a HHLVTSCR designed for I/O protection and as a supply clamp. The holding voltage is slightly higher than Vdd and the reverse conduction is about 0.7 V below ground. Furthermore, the trigger voltage must be below the transient voltage that may cause damage to the core circuit.

The second example, a more complicated one, is ESD protection for communication transceivers widely used in standard PC ports. When connecting a cable to the port, an ESD event modeled by the International Electrochemical Commission standard (IEC) may occur if the cable is electrostatically charged. A first implementation of an ESD protection scheme for these circuits is accomplished by using an open N_Tub HHLVTSCR with a shunt stack of diodes for the I/O pad protection, as shown in FIG. 4C. FIG. 13 shows the resulting I–V characteristics of a p-type HHLVTSCR with open N_Tub. These I–V characteristics are adequate for implementation of the primary ESD protection with the shunt diode stack. The normal operation voltage at the I/O pad is within the range defined by the conduction of the diode stack ($V_{BR}$) for the negative voltages and the trigger voltage ($V_T$) for the positive voltages. A holding voltage lower than the normal operation voltage is allowed in this case because the typical current available at the pad during normal operation is less than the holding current of the protection cell and not enough to sustain a latchup condition.

Another ESD protection scheme for this application is based on the two HHLVTSCRs (N-HHLVTSCR with N-Tub open and P-HHLVTSCR with N-Tub open) for the pad protection cell and an N-HHLVTSCR for the supply clamp, as shown in FIG. 4B. The supply voltages of the circuit are Vss=0 and Vdd=5V, but assuming in this case that the range of the pad voltage is outside the supply voltages, for instance up to 10 V and as low as −10 V. Thus the trigger voltage of the pad protection cell must be larger than 10 V for the positive ESD and smaller than −10 V for the negative ESD. Because of the relatively large trigger voltage in the negative ESD polarity, HHLVTSCRs with N-Tub open are required here for the pad protection cell. If only one HHLVTSCR were used for the protection cell, and the pad is zapped with ESD, then the cell, while providing a sufficiently high trigger voltage in the negative ESD direction, would not satisfy the requirement of a large conducting current in the region. The measured I–V results are similar to that shown in FIG. 12, which indicate that the characteristics for the positive ESD are acceptable, but the slope of I–V curve in the negative ESD region is very small (i.e., low conductivity).

Figure 14:
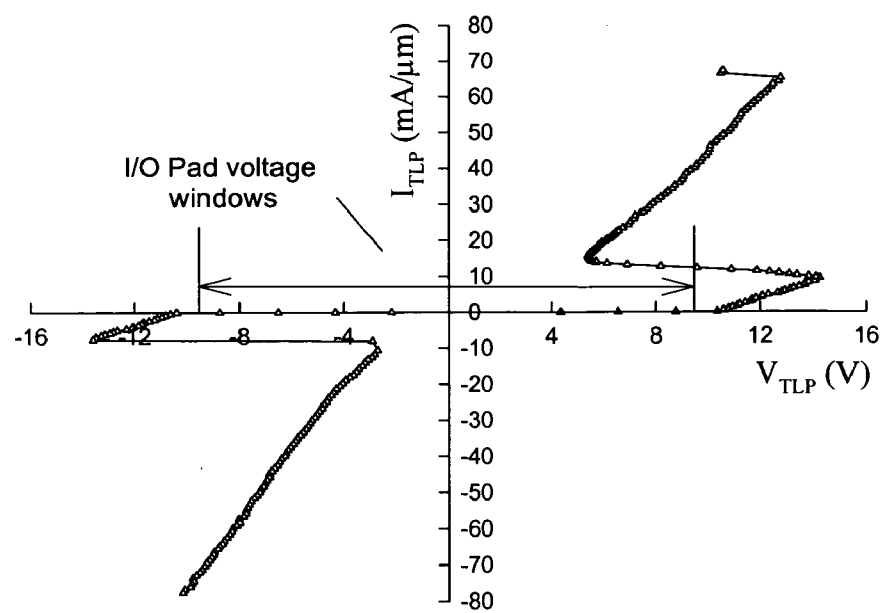
FIG. 14 is a graph of the forward and reverse I–V characteristics of the parallel HHLVTSCRs of FIG. 4B.

The use of a HHLVTSCR with N-Tub connected would yield a steeper slope in the negative region (see FIG. 12), but it does not provide the sufficiently large reverse breakdown voltage required in this application. The parallel combination of N-HHLVTSCR and P-HHLVTSCR shown in FIG. 4B can resolve this problem and yield satisfactory results, as illustrated in FIG. 14.

For the supply clamp, on the other hand, both the holding and trigger voltages must be larger than 5 V and less than 0 in the positive and negative ESD, respectively. This can be readily achieved by using an N-HHLVTSCR with N-Tub connected, and its I–V characteristics are identical to those shown in FIG. 12.

Thus, the availability of various HHLVTSCRs with different types (N and P types), different terminal connections, and different lateral dimensions developed in this work allows one to custom design and implement ESD protection solutions for integrated circuits with specific voltage requirements.

Figure 15:
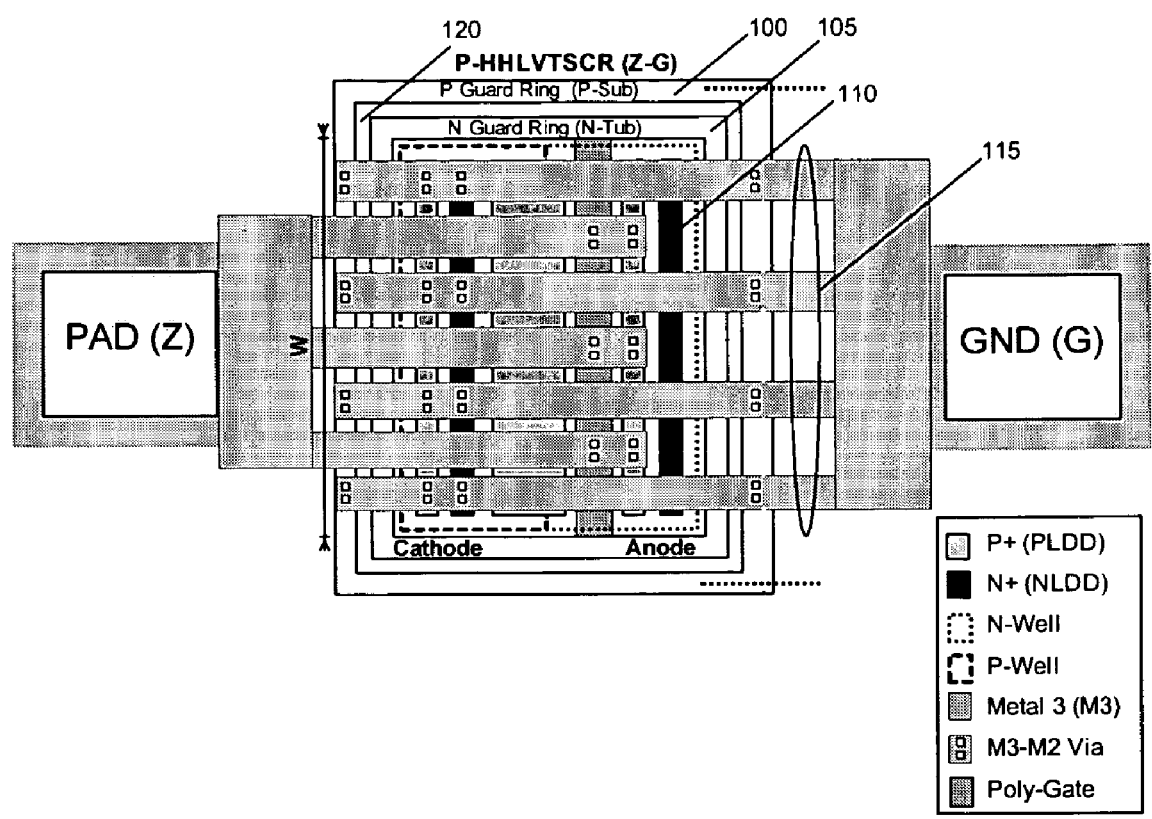
FIG. 15 is the top-view of the layout design for uniform distribution of the ESD current in the device.

For ESD capability scaling-up and on-chip integration of the HHLVTSCRs, FIG. 15 shows the top view of a p-type HHLVTSCR (FIG. 5B), with floating N-Tub. The interdigited pattern 115 for metal 3 (M3) inter-connections between the contact electrodes in the P-HHLVTSCR and pads permits a uniform power distribution during an ESD event and avoids to some extent the generation of a hot spot that conducts to device failure. This layout design also allows efficient integration in the same stack of HHLVTSCR with multiple stripes of width (W) for further increasing the ESD protection capability of the protection cell up to the required level. The p-part of the guard ring 100 is connected to ground and the n-part of the guard ring 105 (electrically connected to the N-tub 12) is floating for this particular layout top-view, but not limited to that configuration. The N+ 110 (26 in FIG. 5B) region in the N-Well 16 is also floating for this top-view but not limited to that configuration. The reverse breakdown of the HHLVTSCR is changed by adjusting the distance between the n- and p-sides of the guard ring 120, which allows a further tuning for the reverse conduction. This characteristic brings design flexibility, especially for bidirectional ESD protection structures.

Tunable High-Holding-Voltage LVTSCRs have been designed, fabricated, and measured to be effective and efficient at providing ESD protection over a wide range of circuit conditions and applications. The holding voltage of the HHLVTSCRs can be adjusted over a wide range to allow designs that support I/O pad voltages outside of the normal power supply voltages without sacrificing ESD performance or risking latchup. Both n- and p-type HHLVTSCRs have been presented. The n-type device performs much better than the p-type device in the low holding voltage regime, but for high holding voltages the p-type device shows superior ESD performance.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A method of forming a high holding low voltage trigger silicon controlled rectifier (HHLVTSCR) comprising the steps of:
   providing a crystalline silicon substrate with p-type doping concentration in the range of $5 \times 10^{15}$ cm$^{-3}$ and an epitaxially-grown n-type layer;
   depositing a deep N-tub layer in an effective area of the HHLVTSCR;
   ion implanting or diffusing N and P type impurities forming an N-well with average doping concentration in the range of $8 \times 10^{17}$ cm$^{-3}$ and a P-well with average doping in the range of $2.6 \times 10^{18}$ cm$^{-3}$ spaced at an optimized distance over the N-tub layer, forming N- and P-type high-doping concentration regions laterally spaced from each other at optimized distances in each of the N-well and P-well;

forming an N type high-doping concentration bridge region over the N-well to P-well junction for an N-HHLVTSCR and a P type high-doping concentration bridge region over the N-well to P-well junction for a P - HHLVTSCR of an optimized dimension and distance from the other regions;

forming an insulated gate over the N-well for the P-HHLVTSCR and an insulated gate over the P-well for the N- HHLVTSCR;

forming a common contact for the high-doping concentration n- and p-type regions in the P-well and the gate for the N- HHLVTSCR and a common contact for the high-doping concentration n- and p-type regions in the P-well for the P- HHLVTSCR;

selectively forming either a common contact for the high-doping concentration n-and p-type regions in the N-well and the gate or a common contact for the high-doping concentration p-type region in the N-well and the gate and a separate contact for the high-doping concentration p-type region in the N-well for the P- HHLVTSCR; and selectively forming either a common contact or separate contacts for the high-doping concentration n- and p-type regions in the N-well for the N-HHLVTSCR.

2. A method for making a high holding, low voltage trigger silicon controlled rectifier device comprising:

forming an N-type layer on a P-type substrate;

forming an N-type tub region comprising a first portion extending from a top surface of the N-type layer to the P-type substrate and a second portion extending into the P-type substrate;

forming an adjacent P-type well region and an adjacent N-type well region in the top surface of the N-type layer between walls of the first portion and over the second portion the N-type tub region;

forming a source region and a drain region of a first conductivity type in one of the wells of a conductivity type opposite the first conductivity type, wherein the drain region extends into the other of the wells of the same conductivity type;

forming an insulated gate over the space between the source and drain regions;

forming a region of the opposite conductivity type in the other well;

forming a contact region of the first conductivity type in the other well and a contact region of the other conductivity type in the one well; and forming a first contact connecting the gate and the source region and forming a first terminal and a second contact connected to the region of the opposite conductivity type and forming a second terminal.

3. The method of claim 2, wherein the first contact connects the contact region of the opposite conductivity type in the one well to the source region.

4. The method of claim 3, wherein the second contact connects the contact region of the first conductivity type in the other well to the region of the opposite conductivity type in the other well.

5. The method of claim 2, wherein the second contact connects the contact region of the first conductivity type in the other well to the region of the opposite conductivity type in the other well.

6. The method of claim 2, further comprising forming a P-type guard ring adjacent the first portion of the N-type tub region and extending from the top surface of the N-type layer into the P-type substrate.

7. The method of claim 2, wherein a space between the P-type guard ring and the first portion of the N-type tub is selected for a given reverse break down voltage of the device.

8. The method of claim 2, wherein a space between the P-type and N-type wells is selected for a given holding and trigger voltage of the device.

9. The method of claim 2, wherein the N-type tub has an impurity net concentration between the net impurity concentrations of the P-type substrate and the P-type well.

10. The method of claim 2, wherein the P-type well has a higher impurity concentration than the N-type well.

* * * * *